United States Patent
Kim et al.

(10) Patent No.: US 7,619,456 B2
(45) Date of Patent: Nov. 17, 2009

(54) WIDE FREQUENCY MULTI-PHASE SIGNAL GENERATOR WITH VARIABLE DUTY RATIO AND METHOD THEREOF

(75) Inventors: Byung-Guk Kim, Daejeon (KR); Lee-Sup Kim, Daejeon (KR); Kwang-Il Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 6 days.

(21) Appl. No.: 11/826,511

(22) Filed: Jul. 16, 2007

(65) Prior Publication Data

US 2008/0025451 A1   Jan. 31, 2008

(30) Foreign Application Priority Data

Jul. 18, 2006   (KR) ...................... 10-2006-0066897

(51) Int. Cl.
*H03H 11/16*   (2006.01)
*H03K 5/13*    (2006.01)
*H03K 3/00*    (2006.01)

(52) U.S. Cl. ...................... 327/237; 327/161; 327/231; 375/364

(58) Field of Classification Search ................. 327/161, 327/231, 237; 375/364
See application file for complete search history.

(56) References Cited

U.S. PATENT DOCUMENTS

| | | | | |
|---|---|---|---|---|
| 6,040,743 | A * | 3/2000 | Bjorklid et al. | 331/57 |
| 6,459,314 | B2 * | 10/2002 | Kim | 327/161 |
| 6,859,081 | B2 * | 2/2005 | Hong et al. | 327/175 |

FOREIGN PATENT DOCUMENTS

| | | |
|---|---|---|
| JP | 2000-114954 | 4/2000 |
| JP | 2001-127601 | 5/2001 |
| JP | 2001-127604 | 5/2001 |
| JP | 2005-311690 | 11/2005 |
| KR | 2002-0020353 | 3/2002 |

* cited by examiner

*Primary Examiner*—Lincoln Donovan
*Assistant Examiner*—John W Poos

(57) ABSTRACT

A multi-phase signal generator may include a duty control buffer configured to receive a first differential input signal and a second differential input signal, and generate a first differential output signal and a second differential output signal having variable duty ratios based on a control voltage, a first edge combiner configured to generate a first pulse signal based on first edges of the respective first and second differential output signals, a second edge combiner configured to generate a second pulse signal based on second edges of the respective first and second differential output signals, and a control voltage generator configured to generate the control voltage in response to a logic signal obtained by performing a logic operation on the first and second pulse signals.

30 Claims, 12 Drawing Sheets

WIDE FREQUENCY MULTI-PHASE SIGNAL GENERATOR WITH VARIABLE DUTY RATIO AND METHOD THEREOF

PRIORITY STATEMENT

This application claims priority under 35 USC § 119 to Korean Patent Application No. 2006-0066897, filed on Jul. 18, 2007, in the Korean Intellectual Property Office (KIPO), the entire contents of which are herein incorporated by reference.

BACKGROUND

1. Field

Example embodiments may relate to an electronic circuit, and more particularly, to a multi-phase signal generator for generating pulse signals having a desired phase difference and a method thereof.

2. Description of the Related Art

Synchronous semiconductor devices may input/output data in synchronization with a clock signal. The synchronous semiconductor devices may include a clock signal generator, which generates an internal clock signal synchronized with an external clock signal.

When a semiconductor device inputs/outputs two bits (or symbols) of data per one data input/output terminal during a single clock cycle, the semiconductor device may include a quadrature phase signal generator, which may generate a multi-phase clock signal including pulses with a phase difference of 90 degrees with respect to an external clock signal.

Conventional quadrature phase signal generators may be implemented by a delay locked loop (DLL) circuit. A DLL circuit may include a voltage-controlled delay line (VCDL), and may generate an in-phase (or 0-degree) signal synchronized with an external clock signal and a quadrature phase signal having a 90-degree phase difference with respect to the external clock signal by adjusting a delay time of each delay element. However, since the DLL circuit may include a VCDL or delay elements connected in series, the circuit design may be complicated and the circuit may occupy a large area. Accordingly, a multi-phase signal generator that occupies a smaller area than the conventional DLL circuit, and/or one which may operate in a wider frequency range is desired.

SUMMARY

Example embodiments may provide a multi-phase signal generator with a reduced circuit area and capable of generating a multi-phase signal without deteriorating signal characteristics in a wide frequency range.

In an example embodiment, a multi-phase signal generator may include a duty control buffer configured to receive a first differential input signal and a second differential input signal, and generate a first differential output signal and a second differential output signal having variable duty ratios based on a control voltage, a first edge combiner configured to generate a first pulse signal based on first edges of the respective first and second differential output signals, and a second edge combiner configured to generate a second pulse signal based on second edges of the respective first and second differential output signals. The example embodiment may further include a control voltage generator configured to generate the control voltage in response to a logic signal obtained by performing a logic operation on the first and second pulse signals.

In another example embodiment, a method of generating a multi-phase signal may include generating a first differential output signal and a second differential output signal based on a first differential input signal, a second differential input signal, and a control voltage such that changing duty ratios of the first differential output signal and the second differential output signal change based on the control voltage, and generating a first pulse signal based on first edges of the first and second differential output signals. The method may further include generating a second pulse signal based on second edges of the first and second differential output signals, and generating the control voltage in response to a logic signal obtained by performing a logic operation on the first and second pulse signals.

BRIEF DESCRIPTION OF THE DRAWINGS

Example embodiments may be more clearly understood from the following detailed description taken in conjunction with the accompanying drawings.

FIG. 1 is a block diagram of a multi-phase signal generator according to an example embodiment;

FIG. 2 is a circuit diagram of an example embodiment of a duty control buffer illustrated in FIG. 1;

FIG. 3 is a circuit diagram of an example embodiment of a rising edge combiner illustrated in FIG. 1;

FIG. 4 is a circuit diagram of an example embodiment of a charge pump (CP) illustrated in FIG. 1;

FIG. 5 is a signal timing chart illustrating the operation of a multi-phase signal generator according to an example embodiment;

FIG. 6 is a block diagram of a multi-phase signal generator according to another example embodiment;

FIG. 7 is a circuit diagram of a duty control buffer illustrated in FIG. 6;

FIG. 8 is a graph illustrating a delay range with respect to a control voltage and a digital control code in a multi-phase signal generator including the duty control buffer illustrated in FIG. 7;

FIG. 9 is a circuit diagram of the duty control buffer illustrated in FIG. 6 according to another example embodiment;

FIG. 10 is a graph illustrating a delay range with respect to a control voltage and a digital control code in a multi-phase signal generator including the duty control buffer illustrated in FIG. 9;

FIG. 11 is a graph obtained by simulating the change in a slope of first and second differential output signals with respect to the change in a control voltage in a multi-phase signal generator according to an example embodiment; and FIG. 12 is a graph illustrating a procedure for the convergence of control voltage in a multi-phase signal generator according to an example embodiment.

DETAILED DESCRIPTION OF EXAMPLE EMBODIMENTS

Figure 1:
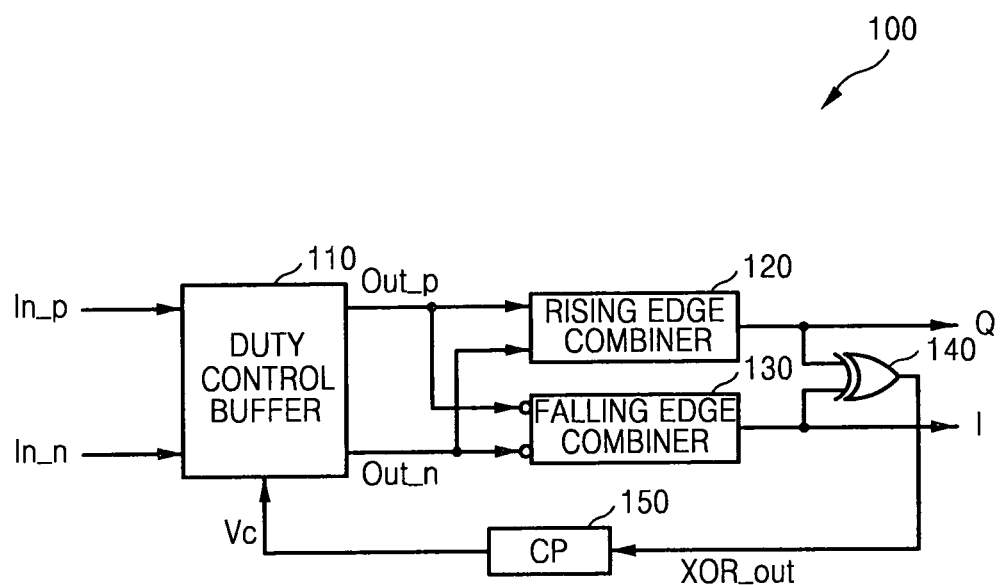
FIGS. 1-12 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The attached drawings may be referred to in order to gain sufficient understanding of the example embodiments, the merits thereof, and the aspects accomplished by the implementation of the example embodiments.

Figure 5:
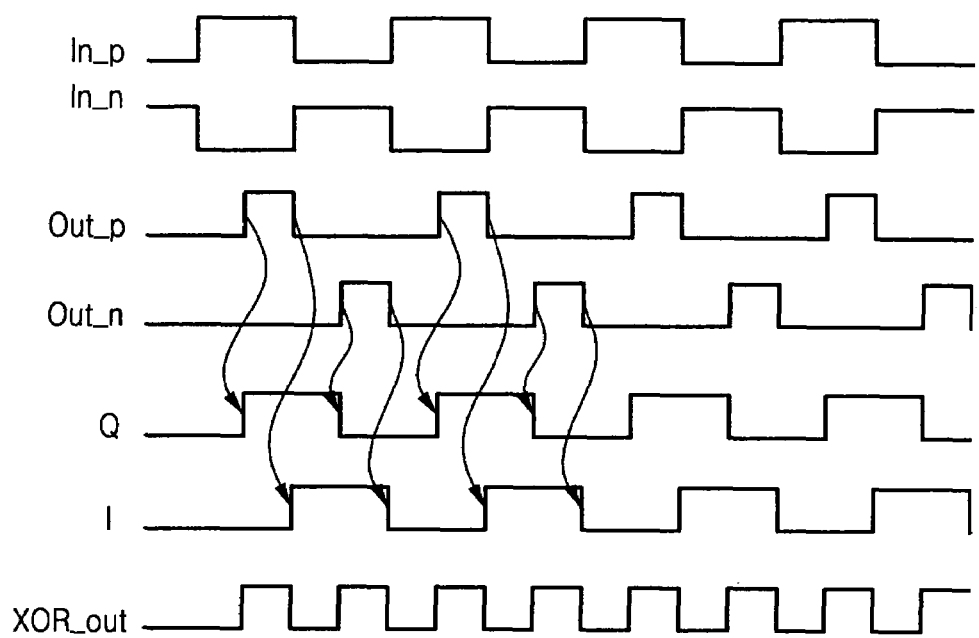

FIG. 1 is a block diagram of a multi-phase signal generator 100 according to an example embodiment. FIG. 5 is a signal timing chart illustrating an operation of the multi-phase signal generator 100 of FIG. 1.

Referring to FIG. 1, the multi-phase signal generator 100 may include a duty control buffer 110, a rising edge combiner 120, a falling edge combiner 130, a logic gate 140, and a charge pump (CP) 150. The logic gate 140 may be an XOR gate. The duty control buffer 110 may receive a first differential input signal In_p and a second differential input signal In_n, and output a first differential output signal Out_p and a second differential output signal Out_n, respectively. The first and second differential output signals Out_p and Out_n may have a variable duty ratio according to a control voltage Vc.

Figure 2:
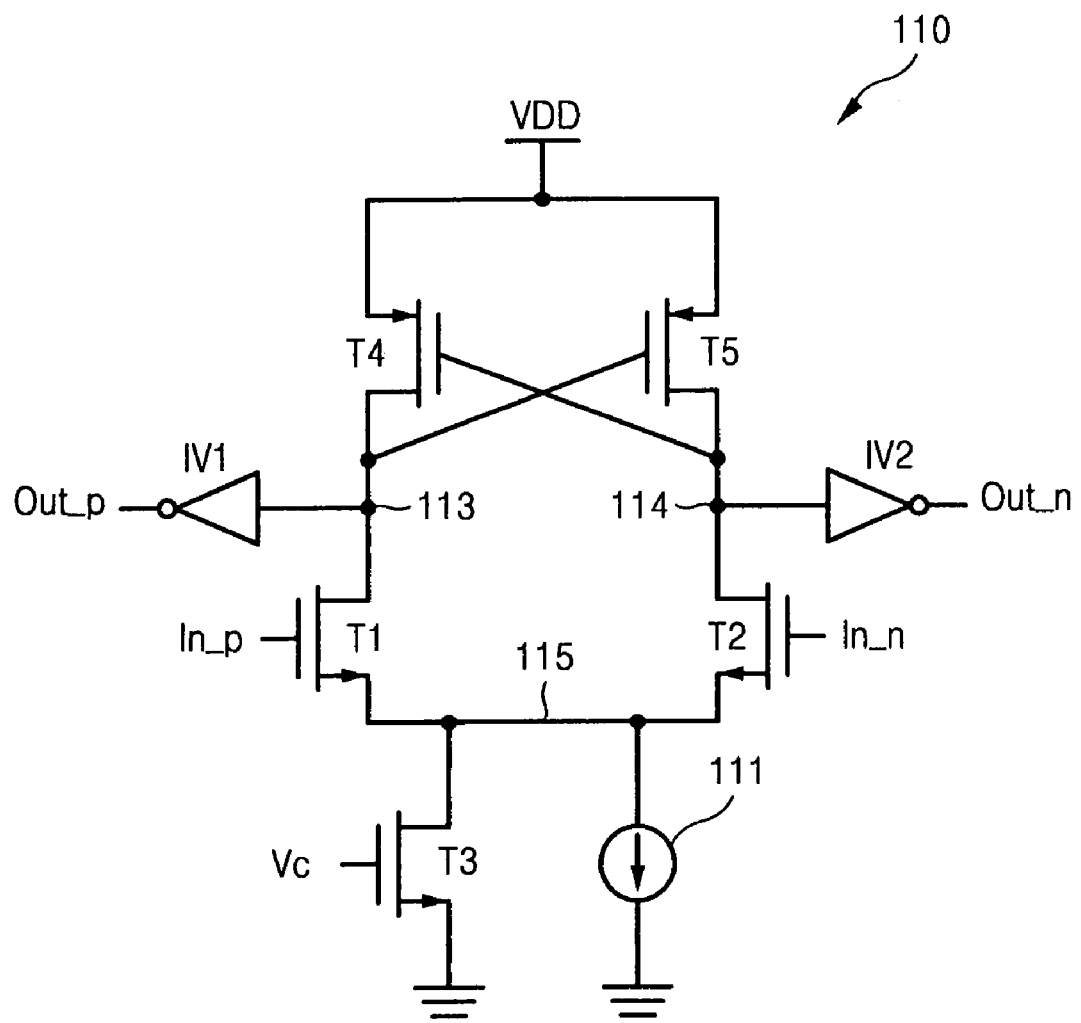

FIG. 2 is a circuit diagram of an example embodiment of the duty control buffer 110 illustrated in FIG. 1. Referring to FIG. 2, the duty control buffer 110 may include a pair of input transistors T1, T2 respectively receiving the first and second differential input signals In_p, In_n through their gates, a control transistor T3, a pair of output transistors T4, T5, a current source 111, and inverters IV1, IV2. The first and second differential input signals In_p, In_n may be pulse signals having a 180-degree phase difference with respect to each other, as illustrated in FIG. 5.

The pair of input transistors T1, T2 may be connected to a common source node 115. The pair of input transistors T1, T2 may also be respectively connected to first and second output nodes 113, 114. The pair of the output transistors T4 and T5 may be connected between a first power supply voltage VDD and the first and second output nodes 113 and, 114, respectively. The gates of the output transistors T4, T5 may be cross-coupled with the second and first output nodes 114, 113, respectively. In other words, the gate of the output transistor T4 may be connected with the second output node 114 and the gate of the output transistor T5 may be connected with the first output node 113.

The control transistor T3 may be adapted to respond to the control voltage Vc. The current source 111 may be connected in parallel with the control transistor T3 between the common source node 115 and a second power supply voltage (e.g., a ground voltage). The control transistor T3 may be turned on or off or has a different level of turn-on (e.g., a different magnitude of turn-on resistance) according to the level of the control voltage Vc.

The inverters IV1, IV2 may be respectively connected to the first and second output nodes 113, 114. The output signals Out_p, Out_n may also respectively output through the inverters IV1, IV2.

The amount of current flowing in the duty control buffer 110 may vary with the control voltage Vc, and therefore, a slope of a waveform of the first and second differential output signals Out_p, Out_n, which may be output in response to the first and second differential input signals In_p, In_n, respectively, may also change. For example, when the control voltage Vc is low, the amount of current may decrease, and therefore, the slope of the waveform of the first and second differential output signals Out_p, Out_n may decrease, e.g., a delay time increase. Accordingly, the duty ratio of the first and second differential output signals Out_p, Out_n may decrease. In other words, a period of high level may become shorter than a period of low level. On the other hand, when the control voltage Vc is high, the amount of current may increase, and therefore, the slope of the waveforms of the first and second differential output signals Out_p, Out_n may increase, e.g., a delay time decreases. Accordingly, the duty ratio of the first and second differential output signals Out_p, Out_n may increase.

As described above, the duty ratio of the first and second differential output signals Out_p, Out_n may change according to the control voltage Vc. In other words, the first and second differential output signals Out_p, Out_n may be pulse signals, which may have the same cycle as the first and second differential input signals In_p, In_n, respectively, as illustrated in FIG. 5 and which may have a duty ratio that varies with the control voltage Vc.

Referring back to FIG. 1, the rising edge combiner 120 may combine rising edges of the respective first and second differential output signals Out_p, Out_n and generate a first pulse signal Q. In detail, the rising edge combiner 120 may generate a quadrature-phase (e.g., 90 degrees) signal Q which transits to a high level in response to a rising edge of the first differential output signal Out_p, and transits to a low level in response to a rising edge of the second differential output signal Out_n.

The falling edge combiner 130 may combine falling edges of the respective first and second differential output signals Out_p, Out_n and generate a second pulse signal I. In detail, the falling edge combiner 130 may generate an in-phase (e.g., 0 degrees) signal I which transits to a high level in response to a falling edge of the first differential output signal Out_p, and transits to a low level in response to a falling edge of the second differential output signal Out_n.

Figure 3:
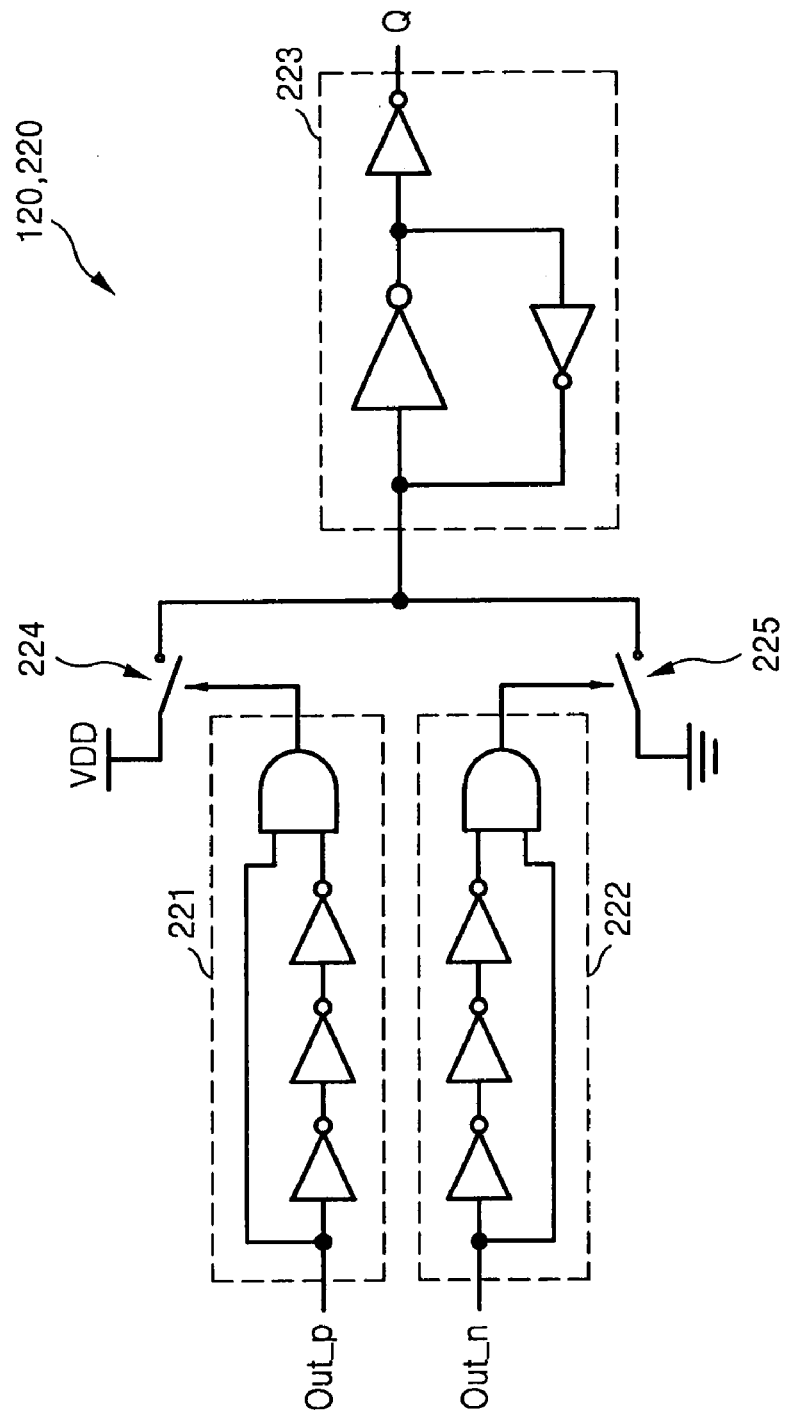

FIG. 3 is a circuit diagram of the rising edge combiner 120 according to an example embodiment. As will be described in detail below, the rising edge combiner 220 in FIG. 6 may have the same implementation as shown in FIG. 3. Referring to FIG. 3, the rising edge combiner 120, 220 may include a first rising edge detector 221, a second rising edge detector 222, a latch 223, and switches 224, 225. Each of the first and second rising edge detectors 221, 222 may include a plurality of inverters (e.g., three) and an AND gate.

The first rising edge detector 221 may generate a pulse signal responding to a rising edge of the first differential output signal Out_p. The switch 224 may be turned on in response to an output signal of the first rising edge detector 221 and transmit a first power supply voltage VDD level signal to the latch 223. Accordingly, the output signal Q of the rising edge combiner 120, 220 may transit from the low level to the high level in response to the rising edge of the first differential output signal Out_p.

The second rising edge detector 222 may have the same structure as the first rising edge detector 221. The second rising edge detector 222 may generate a pulse signal responding to a rising edge of the second differential output signal Out_n. The switch 225 may be turned on in response to an output signal of the second rising edge detector 222 and transmit a second power supply voltage (e.g., ground voltage) level signal to the latch 223. Accordingly, the output signal Q of the rising edge combiner 120, 220 may transit from the high level to the low level in response to the rising edge of the second differential output signal Out_n.

The falling edge combiner 130 may be implemented in a similar structure to that of the rising edge combiner 120, 220 except that the AND gates in the detectors are replaced by NOR gates to create falling edge detectors. For brevity, a detailed description thereof will be omitted.

Referring back to FIG. 1, the logic gate 140 may perform an XOR operation on the in-phase signal I and the quadrature-phase signal Q and output an XOR signal XOR_out. As illustrated in FIG. 5, the XOR signal XOR_out may be at a high level while the levels of the in-phase signal I and the quadrature-phase signal Q may be different from each other, and may be at a low level while the levels of the in-phase signal I and the quadrature-phase signal Q may be the same.

The CP 150 may pump charges in response to the XOR signal XOR_out to generate the control voltage Vc, and the control voltage Vc may be input to the duty control buffer 110, thereby forming a feedback loop. When the feedback loop is formed such that the duty of the XOR signal XOR_out is 50%, the in-phase signal I synchronized with the first differential input signal In_p and the quadrature-phase signal Q having a 90-degree phase difference with respect to the first differential input signal In_p may be obtained.

Figure 4:
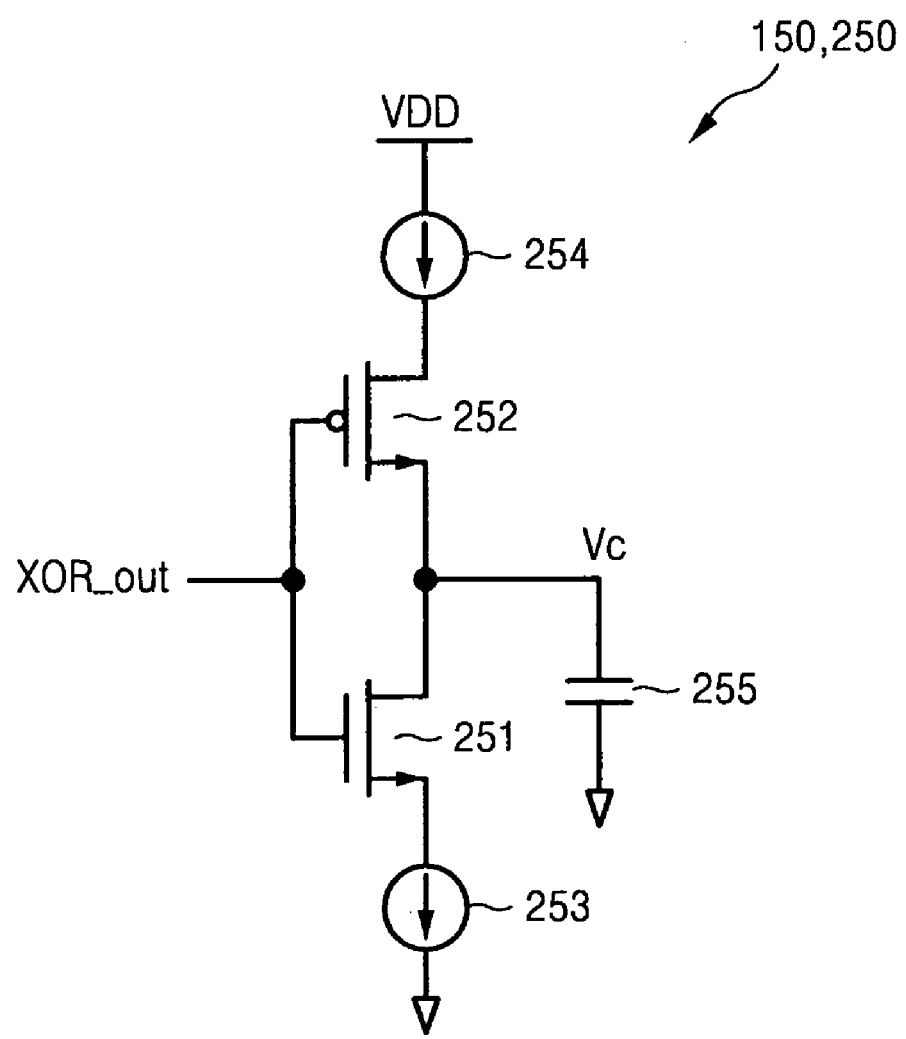

FIG. 4 is a circuit diagram of the CP 150 (FIG. 1) according to an example embodiment. As will be described in detail below, the CP 250 in FIG. 6 may have the same implementation as shown in FIG. 4. Referring to FIG. 4, the CP 150, 250 may include an NMOS transistor 251, a PMOS transistor 252, current sources 253 and 254, and a capacitor 255.

The NMOS transistor 251 and the PMOS transistor 252 may be turned on or off in response to the XOR signal XOR_out. When the XOR signal XOR_out is at a low level, the PMOS transistor 252 may be turned on and current may be supplied from the current source 254 to the capacitor 255, and therefore, the level of the control voltage Vc may increase. On the other hand, when the XOR signal XOR_out may be at a high level, the NMOS transistor 251 may be turned on and current may be discharged by the current source 253 from the capacitor to the ground voltage, and therefore, the level of the control voltage Vc may decrease.

The multi-phase signal generator 100 according to the example embodiment may have a simple circuit structure, which occupies less area than a conventional quadrature phase signal generator using a delay locked loop (DLL).

In the multi-phase signal generator 100 according to the above-described example embodiment, the duty ratio of the first and second differential output signals Out_p, Out_n may be controlled by only the control voltage Vc. However, the duty ratio of the first and second differential output signals Out_p, Out_n may also be controlled by a digital control code in addition to the control voltage Vc. In this case, a control range for the duty ratio of the first and second differential output signals Out_p, Out_n may increase, and therefore, a multi-phase signal generator may operate in a wider frequency range.

Figure 6:
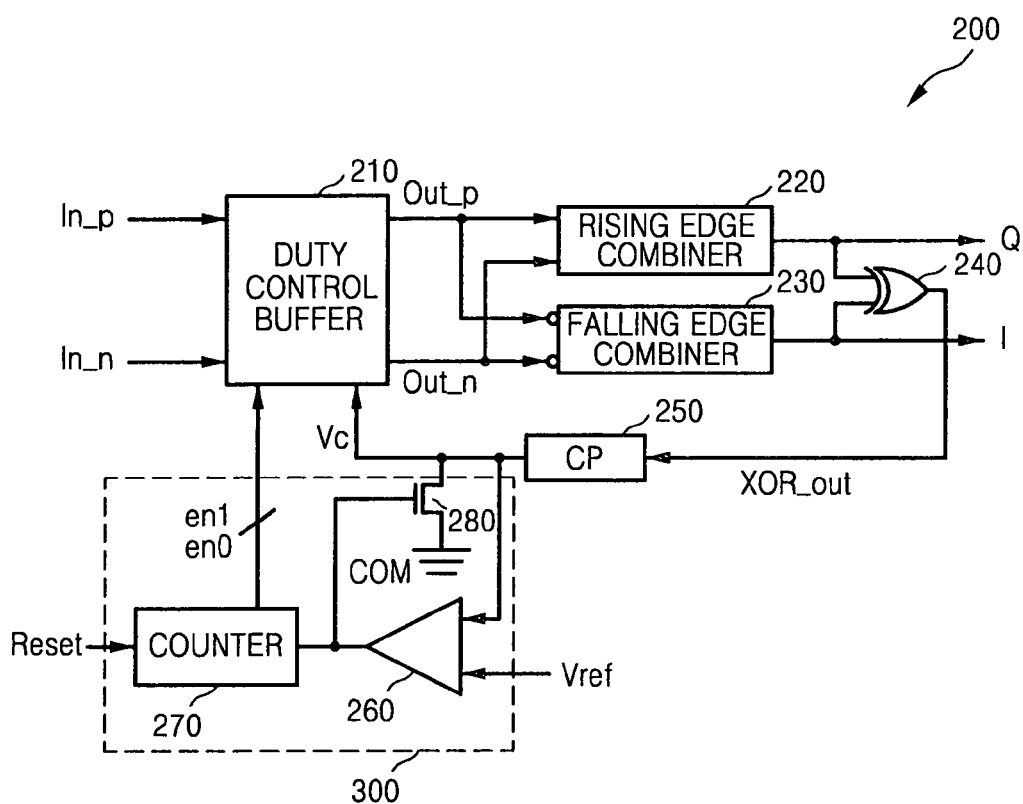

FIG. 6 is a block diagram of a multi-phase signal generator 200 according to another example embodiment. The multi-phase signal generator 200 may include a duty control buffer 210, a rising edge combiner 220, a falling edge combiner 230, a logic gate 240, a CP 250, and a digital control code generator 300. The logic gate 240 may be an XOR gate.

The duty control buffer 210 may receive first and second differential input signals In_p, In_n having a 180-degree phase difference with respect to each other and generate first and second differential output signals Out_p, Out_n, which may have a duty ratio changing according to a control voltage Vc and a digital control code (including two bits en1 and en0).

Figure 7:
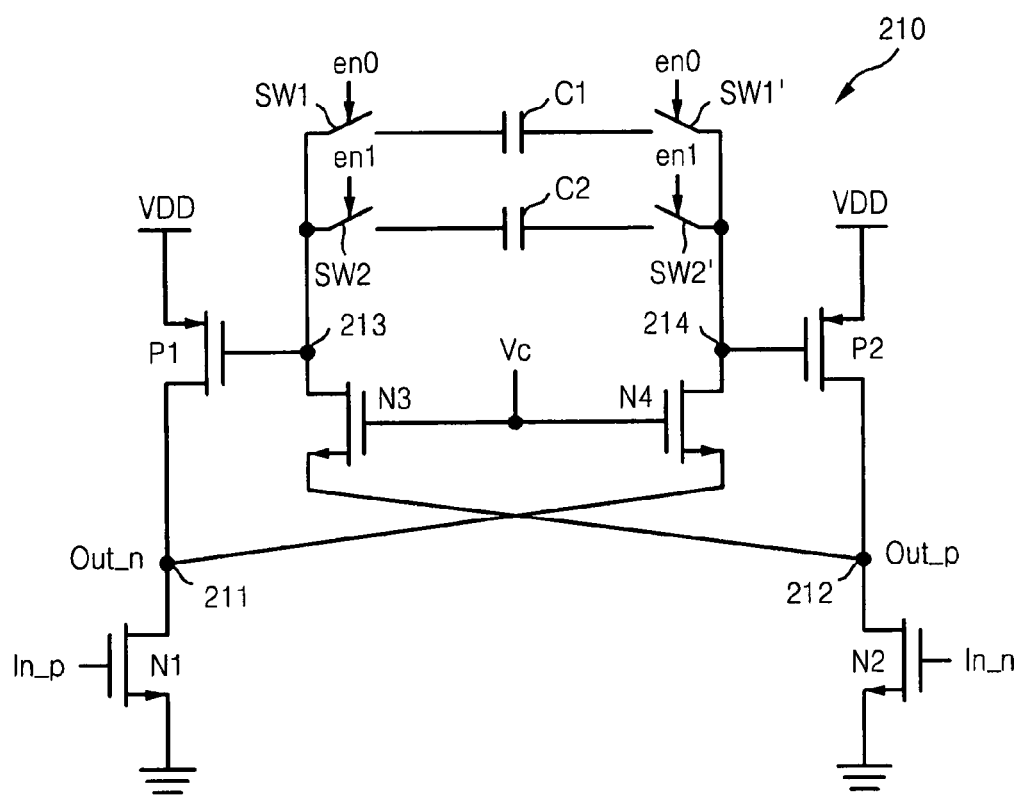

FIG. 7 is a circuit diagram of the duty control buffer 210 illustrated in FIG. 6. Referring to FIG. 7, the duty control buffer 210 may include a pair of input transistors N1, N2, a pair of output transistors P1, P2, a pair of control transistors N3, N4, first and second capacitors C1, C2, and switches SW1, SW2, SW1' and SW2'. The first and second differential input signals In_p, In_n may be pulse signals having a 180-degree phase difference with respect to each other, as illustrated in FIG. 5.

The input transistors, e.g., a first NMOS transistor N1 and a second NMOS transistor N2, may be connected between a ground voltage and first and second output nodes 211, 212, respectively. The output transistors, e.g., a first PMOS transistor P1 and a second PMOS transistor P2 may be connected between a power supply voltage VDD and the first and second output nodes 211, 212, respectively. The first and second differential input signals In_p, In_n may be respectively input to gates of the respective first and second NMOS transistors N1, N2.

The control transistors, e.g., a third NMOS transistor N3 and a fourth NMOS transistor N4 may be cross-coupled between a first node 213 and the second output node 212 and between a second node 214 and the first output node 211, respectively. The control voltage Vc may be input to gates of the respective third and fourth NMOS transistors N3 and N4.

The capacitors C1 and C2 may be disposed in parallel between a gate of the first PMOS transistor P1 and a gate of the second PMOS transistor P2, e.g., between the first node 213 and the second node 214. The second capacitor C2 has a higher capacitance than the first capacitor C1. The switches SW1, SW2 may be between the first node 213 and the first and second capacitors C1, C2, respectively. The switches SW1', SW2' may be between the second node 214 and the capacitors C1 and C2, respectively. Each of the switches SW1, SW2, SW1' and SW2' may be turned on in response to a corresponding bit of the digital control code. For example, the switches SW1 and SW1' may be turned on in response to a first bit en0 of the digital control code, and the switch SW2' may be turned on in response to a second bit en1 of the digital control code. Accordingly, when the digital control code (en1 and en0) is initialized to "00", switches SW1, SW2, SW1' and SW2' may be turned off and the first and second capacitors C1, C2 may not connected.

When the digital control code (en1 and en0) increases to "01", the switch SW1 and SW1' may be turned on and the first capacitor C1 may be connected between the first and second nodes 213, 214. When the digital control code (en1 and en0) increases to "10", the switches SW2 and SW2' may be turned on and the second capacitor C2 may be connected between the first and second nodes 213, 214. When the digital control code (en1 and en0) increases to "11", the switches SW1, SW2, SW1' and SW2' may be turned on and the first and second capacitors C1, C2 may be connected in parallel between the first and second nodes 213, 214. Accordingly, when the digital control code (en1 and en0) increases, the total capacitance of the first and second capacitors C1, C2 connected between the first and second nodes 213, 214 may also increase.

As described above, since the switches SW1, SW2, SW1' and SW2' may be selectively turned on according to the digital control code (en1 and en0), the first and second capacitors C1, C2 may be selectively connected between the first and second nodes 213, 214. The capacitance of the second capacitor C2 may be double the capacitance of the first capacitor C1. In the example embodiment, only the first and second capacitors C1, C2 are illustrated, but it is obvious to a person of ordinary skill that the number and the capacitance of the capacitors may be different.

As described above, since capacitance in the duty control buffer 210 may vary with the digital control code (en1 and en0), the duty ratio of the first and second differential output signals Out_p, Out_n generated by the control voltage Vc at the first and second nodes 211, 212, respectively, may also change.

The rising edge combiner 220, the falling edge combiner 230, the logic gate 240, and the CP 250 may be the same as the rising edge combiner 120, the falling edge combiner 130, the logic gate 140, and the CP 150 illustrated in FIG. 1 and described with respect to FIGS. 3 and 4. For brevity, the detailed descriptions thereof will be omitted. To reiterate, the logic gate 240 may perform an XOR operation on the first and second pulse signals Q and 1, and the XOR signal XOR_out may be an output from the logic gate 240. The CP 250 may pump charge in response to the XOR signal XOR_out to generate the control voltage Vc. The control voltage Vc may be input to the duty control buffer 210 and the digital control code generator 300.

The digital control code generator 300 may include a comparator 260, a counter 270, and a level-down transistor 280 as illustrated in FIG. 6.

The comparator 260 may compare the control voltage Vc with a reference voltage Vref and output a comparison result signal COM. In detail, when the control voltage Vc is higher than the reference voltage Vref, the comparison result signal COM may be generated at a high level. When the comparison result signal COM is at the high level, the level-down transistor 280 may be turned on and the level of the control voltage Vc may decrease. When the control voltage Vc is lower than the reference voltage Vref, the comparison result signal COM may be generated at a low level and the level-down transistor 280 may be turned off.

The counter 270 may increase the digital control code (en1 and en0) in response to the comparison result signal COM. For example, each time when the comparison result signal COM is activated to the high level, the counter 270 may sequentially increase the digital control code (en1 and en0) in order of 00, 01, 10, and 11.

Figure 8:
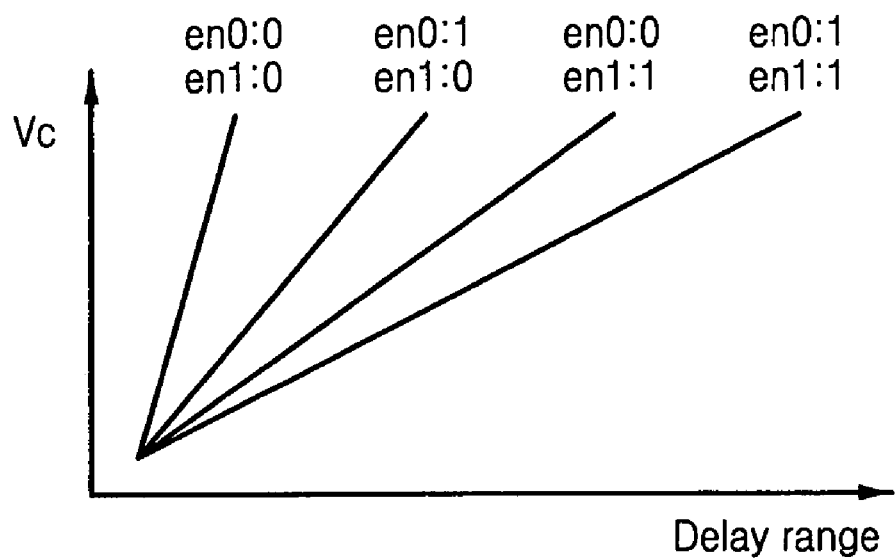

FIG. 8 is a graph illustrating a delay range with respect to the control voltage Vc and the digital control code (en1 and en0) in a multi-phase signal generator having the duty control buffer 210 illustrated in FIG. 7. The operation of the duty control buffer 210 will be described with respect to the control voltage Vc and the digital control code (en1 and en0) with reference to FIGS. 7 and 8 below.

Referring to FIG. 8, the digital control code (en1 and en0) may initially reset to "00". When the control voltage Vc increases while the digital control code (en1 and en0) is "00", turn-on resistance of the control transistors N3, N4 may decrease, and therefore, output resistance may decrease at the first and second output nodes 211, 212. However, when the turn-on resistance of the control transistors N3, N4 decreases, gate capacitance of the output transistors P1, P2 may increase. As a result, due to the increase in the gate capacitance of the output transistors P1, P2 with the increase of the control voltage Vc, the slope of the first and second differential output signals Out_p, Out_n may decrease, and the pulse width (e.g., high level period) thereof may decrease. In other words, a delay time may increase.

If a duty ratio is a ratio of a high level period to a single cycle period in a pulse signal, when the control voltage Vc increases, the duty ratio of the first and second differential output signals Out_p, Out_n may decrease. When the duty ratio of the first and second differential output signals Out_p, Out_n is 25% as illustrated in FIG. 5, the first and second pulse signals I and Q may have a 90-degree phase difference with respect to each other.

When the control voltage Vc is higher than the reference voltage Vref while the digital control code (en1 and en0) is "00", the comparison result signal COM may be generated at a high level. When the comparison result signal COM is at the high level, the digital control code (en1 and en0) may be increases to "01". As a result, the level-down transistor 280 may be turned on and the level of the control voltage Vc may decrease. Thereafter, when the control voltage Vc is higher than the reference voltage Vref again, the comparison result signal COM may be generated at the high level, and the digital control code (en1 and en0) may increase to "10". As a result, the level-down transistor 280 may be turned on.

Accordingly, as illustrated in FIG. 8, when the control voltage Vc and the digital control code (en1 and en0) are increased, the delay time may also increase, and the duty ratio of the first and second differential output signals Out_p, Out_n may decrease.

The reference voltage Vref may be set to a value at which the delay time may no longer increase even if the control voltage Vc is increased while the digital control code (en1 and en0) is fixed, for example, a value at which the duty ratio is no longer controlled.

Figure 9:
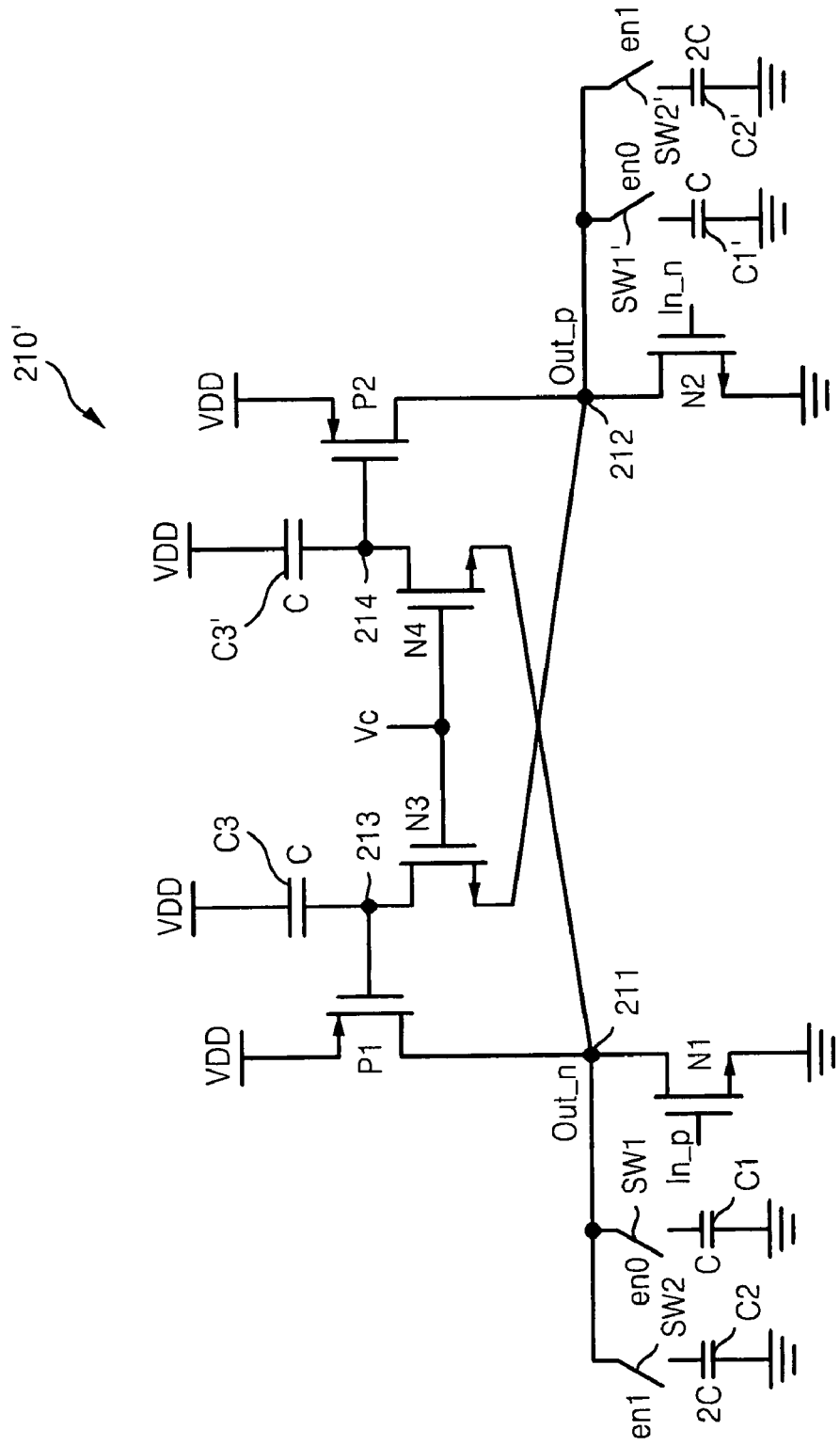

FIG. 9 is a circuit diagram of a duty control buffer 210' according to another example embodiment. Referring to FIG. 9, the duty control buffer 210' may include a pair of the input transistors N1, N2, a pair of the output transistors P1, P2, a pair of the control transistors N3, N4, capacitors C1, C2, C3, C1', C2' and C3', and switches SW1, SW2, SW1' and SW2'. The capacitance of the capacitors C2 and C2' may be greater (e.g., double as shown in FIG. 9) than the capacitance of the capacitors C1 and C1'. The connection and the operation of the input transistors N1, N2, the output transistors P1, P2, and the control transistors N3, N4 may be the same as those in the duty control buffer 210 illustrated in FIG. 7, with the exception that the connection of the capacitors C1, C2 may be different from that in the duty control buffer 210 illustrated in FIG. 7. Accordingly, only the differences between the duty control buffer 210 and the duty control buffer 210' will be described below.

The capacitor C3 having a desired capacitance C may be connected between the power supply voltage VDD and the gate of the first PMOS transistor P1, e.g., the first node 213. The capacitor C3' having a desired capacitance C may be connected between the power supply voltage VDD and the second PMOS transistor P2, e.g., the second node 214. The capacitors C1 and C2 may be disposed in parallel between the first output node 211 and the second power supply voltage (e.g., the ground voltage). The capacitors C1' and C2' may be disposed in parallel and between the second output node 212 and the second power supply voltage. The switches SW1, SW2 may be between the first output node 211 and the capacitors C1 and C2. The switches SW1', SW2' may be between the second output node 212 and the capacitors C1', C2'.

Each of the switches SW1, SW2, SW1', and SW2' may be turned on in response to a corresponding bit of the digital control code. For example, the switches SW1 and SW1' may be turned on in response to a first bit en0 of the digital control code, and the switches SW2 and SW2' may be turned on in response to a second bit en1 of the digital control code. Accordingly, when the digital control code (en1 and en0) is initialized to "00", the switches SW1, SW1', SW2 and SW2' may be turned off and the capacitors C1, C1', C2 and C2' may not be connected.

When the digital control code (en1 and en0) increases to "01", the switches SW1, SW1' may be turned on and the capacitors C1, C1' may be connected between the first output node 211 and the ground voltage and between the second output nodes 212 and the ground voltage, respectively. When the digital control code (en1 and en0) increases to "10", the second switch SW2 is turned on and the capacitor C2 is connected between the first output node 211 and the ground voltage and between the second output node 212 and the ground voltage, respectively. When the digital control code (en1 and en0) increases to "11", the switches SW1, SW2, may be turned on and the capacitors C1, C2 may be connected in parallel between the first output node 211 and the ground voltage. When the digital control code (en1 and en0) increases to "11", the switches SW1' and SW2' may be turned on and the capacitors C1', C2' may be connected in parallel between the second output node 212 and the ground voltage. Accordingly, when the digital control code (en1 and en0) increases, the total capacitance of the capacitors C1, C2, C1' and C2' connected to the first and second output nodes 211, 212 also increases. As a result, the waveforms of the first and second differential output signals Out_p, Out_n may be changed.

As described above, if the capacitance in the duty control buffer 210' is changed according to the digital control code (en1 and en0), the duty ratio of the first and second differential output signals Out_p, Out_n generated by the control voltage Vc at the first and second output nodes 211, 212 may also change.

Figure 10:
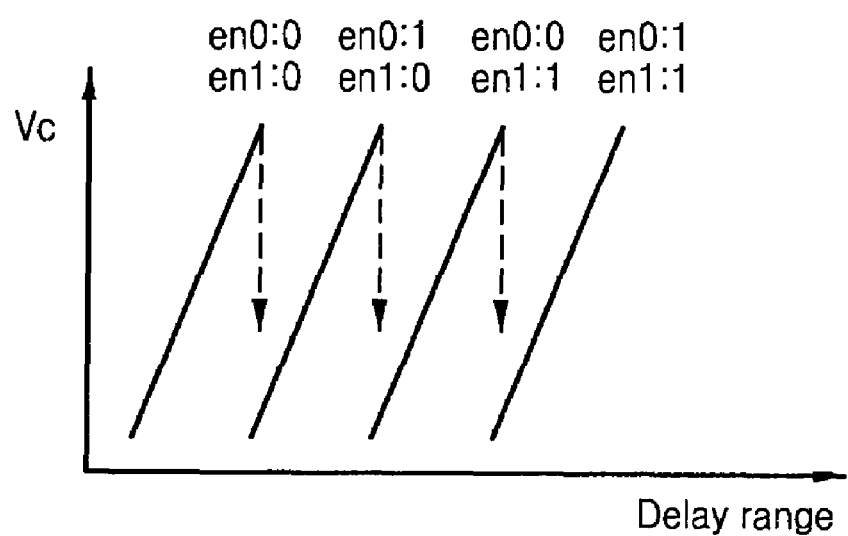

FIG. 10 is a graph illustrating a delay range with respect to the control voltage Vc and the digital control code (en1 and en0) in a multi-phase signal generator including the duty control buffer 210' illustrated in FIG. 9.

Referring to FIG. 8, when the duty control buffer 210 is used, the slope change in the delay time versus the control voltage Vc may be different according to the digital control code (en1 and en0). In other words, the change in the delay time with respect to the control voltage Vc may be least when the digital control code (en1 and en0) is "00" and may increase as the digital control code (en1 and en0) increases. Differently, referring to FIG. 10, when the duty control buffer 210' is used, the slope change in the delay time versus the control voltage Vc may be the same with respect to the digital control code (en1 and en0). However, a range of variable delay time (e.g., a delay range) may be different according to the digital control code (en1 and en0). The different delay ranges according to the digital control code (en1 and en0), may overlap with each other.

Figure 11:
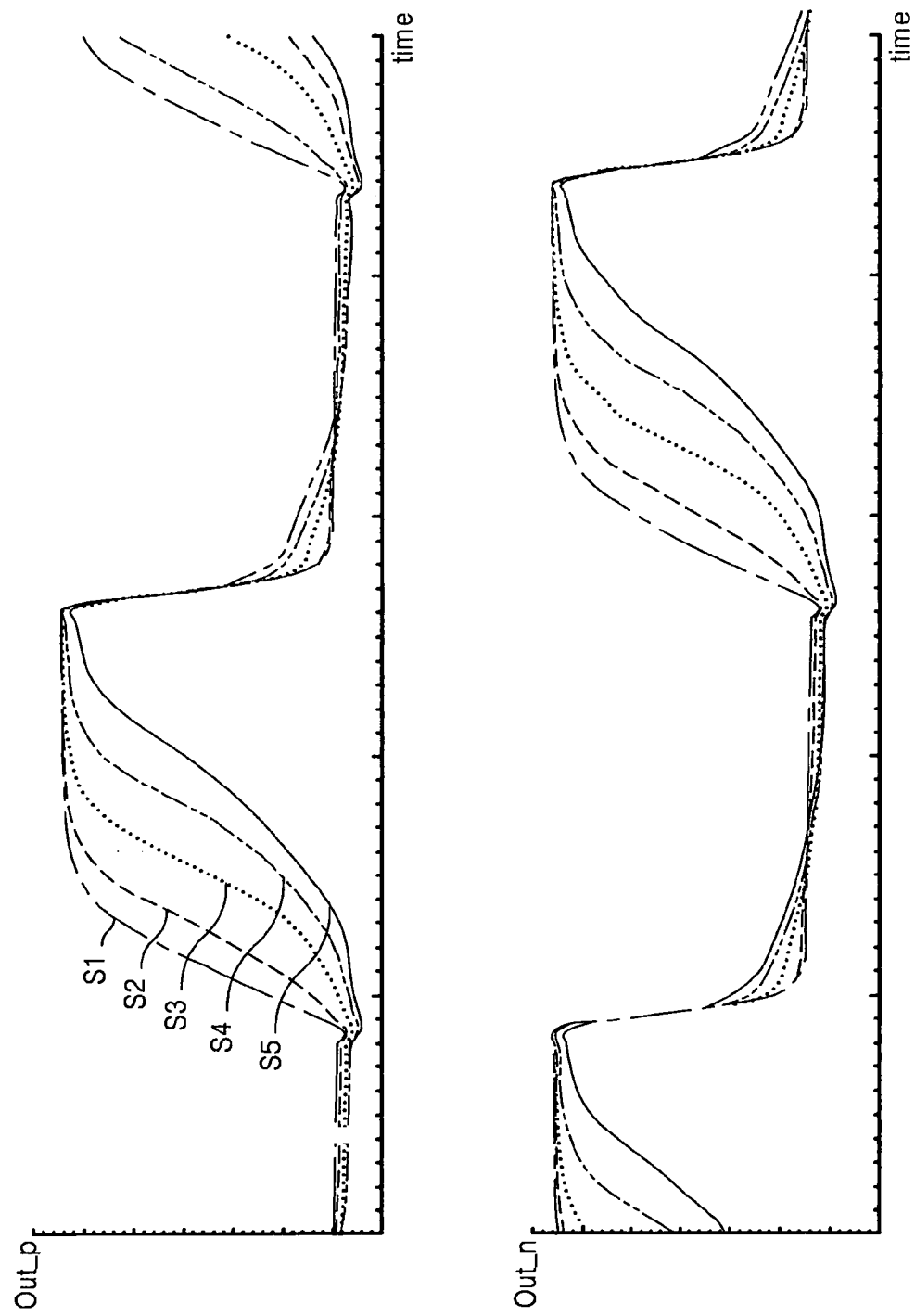

FIG. 11 is a graph simulating the change in slope of first and second differential output signals Out_p and Out_n with respect to the change in the control voltage Vc in the multi-phase signal generator 200 illustrated in FIGS. 6 and 7. Referring to FIG. 11, when the control voltage Vc increases, the slope of a rising edge of the first and second differential output signals Out_p and Out_n may decrease. In other words, when the control voltage Vc is the lowest, graph S1 may be obtained. When the control voltage Vc increases, graph S1 may sequentially change to graphs S2, S3, S4 and S5.

Figure 12:
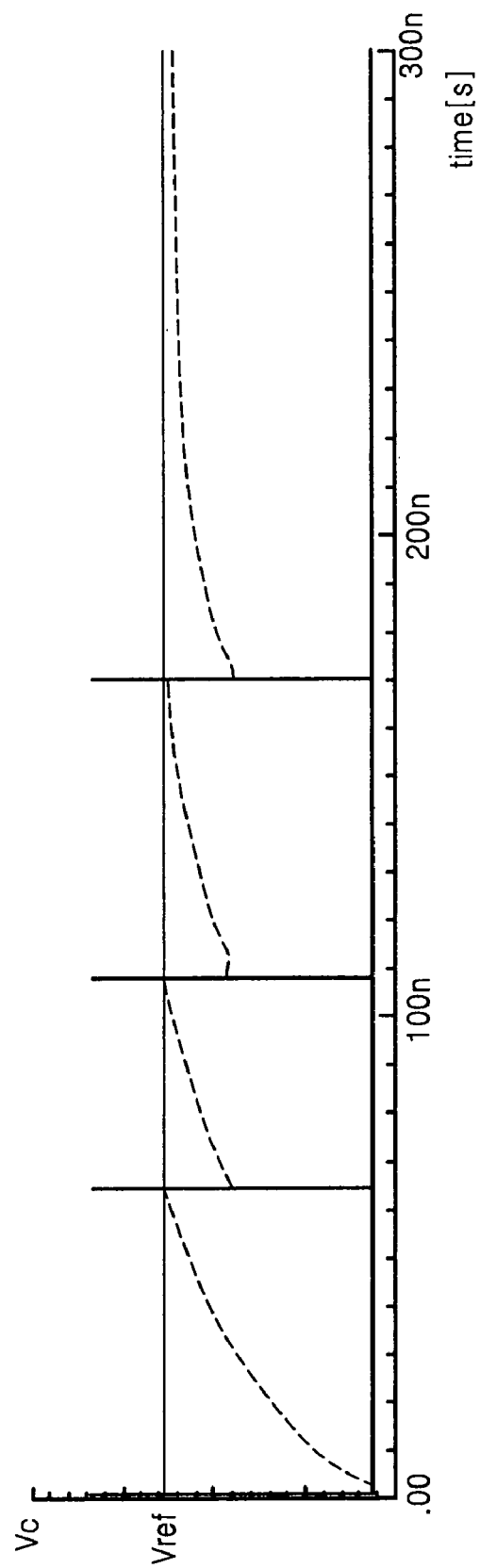

FIG. 12 is a graph illustrating a procedure for the convergence of the control voltage in the multi-phase signal generator 200 illustrated in FIGS. 6 and 7. Referring to FIG. 12, when the control voltage Vc increases and becomes higher than the reference voltage Vref while the digital control code (en1 and en0) is "00", the digital control code (en1 and en0) may increase to "01" and the control voltage Vc may decrease by the level-down transistor 280 (FIG. 6). When the control voltage Vc increases and becomes higher than the reference voltage Vref while the digital control code (en1 and en0) is "01", the digital control code (en1 and en0) may increase to "10" and the control voltage Vc may decrease again by the level-down transistor 280. Through this operation, the control voltage Vc may converge to a level slightly lower than the reference voltage Vref.

As described above, according to the example embodiments, a multi-phase signal, for example, an in-phase signal and a quadrature-phase signal which have a 90-degree phase difference with respect to each other may be generated without deterioration of signal characteristics in a wide frequency range. In addition, the example embodiments may provide a multi-phase signal generator having a simpler circuit than a conventional DLL, thereby decreasing the chip area for this circuit.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the invention. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the invention.

What is claimed is:

1. A multi-phase signal generator comprising:
   a duty control buffer configured to receive a first differential input signal and a second differential input signal, and generate a first differential output signal and a second differential output signal having variable duty ratios based on a control voltage;
   a first edge combiner configured to generate a first pulse signal based on first edges of the respective first and second differential output signals;
   a second edge combiner configured to generate a second pulse signal based on second edges of the respective first and second differential output signals; and
   a control voltage generator configured to generate the control voltage in response to a logic signal obtained by performing a logic operation on the first and second pulse signals,
   wherein the first pulse signal transits to a first level in response to the first edge of one of the first and second differential output signals, transits to a second level in response to the first edge of the other of the first and second differential output signals, and
   the second pulse signal transits to the first level in response to the second edge of one of the first and second differential output signals, transits to the second level in response to the second edge of the other of the first and second differential output signals.

2. The multi-phase signal generator of claim 1, wherein the duty control buffer comprises:
   a pair of input transistors including a first input transistor disposed between a first output node and a common node, a second input transistor disposed between a second output node and the common node, and the first and second input transistors configured to respectively receive the first and second differential input signals;
   a pair of output transistors including a first output transistor disposed between the first output node and a first power supply voltage, a second output transistor disposed between the second output node and the first power supply voltage, and each gate of the first and second output transistors crossed-coupled with the second and first output nodes, respectively; and
   a control transistor connected to the common node and configured to receive the control voltage.

3. The multi-phase signal generator of claim 2, wherein the control transistor is connected between the common node and a second power supply voltage.

4. The multi-phase signal generator of claim 2, wherein a current source is disposed between the common node and the second power supply voltage.

5. The multi-phase signal generator of claim 3, wherein the second power supply is ground.

6. A multi-phase signal generator comprising:
   a duty control buffer configured to receive a first differential input signal and a second differential input signal, and generate a first differential output signal and a second differential output signal having variable duty ratios based on a control voltage;
   a first edge combiner configured to generate a first pulse signal based on first edges of the respective first and second differential output signals;
   a second edge combiner configured to generate a second pulse signal based on second edges of the respective first and second differential output signals;
   a control voltage generator configured to generate the control voltage in response to a logic signal obtained by performing a logic operation on the first and second pulse signals; and
   a digital control code generator configured to compare the control voltage with a reference voltage and generate a digital control code based on a result of the comparison,
   wherein the duty control buffer changes the variable duty ratios of the first and second differential output signals based on the control voltage and the digital control code.

7. The multi-phase signal generator of claim 6, wherein the duty control buffer comprises:
   a pair of output transistors including a first output transistor disposed between a first output node and a first power supply voltage, a second output transistor disposed between a second output node and the first supply power supply voltage, a gate of the first output transistor connected to a first control node, and a gate of the second output transistor connected to a second control node;
   a pair of input transistors including a first input transistor disposed between the first output node and a second power supply voltage, a second input transistor disposed between the second output node and the second power supply voltage, and the first and second input transistors configured to respectively receive the first and second differential input signals;
   a pair of control transistors including a first control transistor disposed between the first control node and the second output node, a second control transistor disposed between the second control node and the first output node, and the pair of control transistors configured to receive the control voltage;
   a plurality of capacitors; and
   a plurality of switches configured to selectively connect the plurality of capacitors between the gates of the pair of output transistors in response to the digital control code.

8. The multi-phase signal generator of claim 7, wherein the plurality of switches are configured to increase a capacitance connected between the gates of the pair of output transistors as the digital control code.

9. The multi-phase signal generator of claim 8, wherein the plurality of capacitors includes a first capacitor and a second capacitor, and a capacitance of the second capacitor is double a capacitance of the first capacitor.

10. The multi-phase signal generator of claim 7, wherein the duty ratio increases when the digital control code increases.

11. The multi-phase signal generator of claim 6, wherein the duty control buffer comprises:
   a pair of output transistors including a first output transistor disposed between a first output node and a first power supply voltage, a second output transistor disposed between a second output node and the first power supply voltage, a gate of the first output transistor connected to a first control node, and a gate of the second output transistor connected to a second control node;
   a pair of input transistors including a first input transistor disposed between the first output node and a second power supply voltage, a second input transistor disposed between the second output node and the second supply voltage, and the first and second input transistors configured to respectively receive the first and second differential input signals;
   a pair of control transistors including a first control transistor disposed between the first control node and the second output node, a second control transistor disposed between the second control node and the first output node, and the pair of control transistors configured to receive the control voltage;
   a first plurality of capacitors connected to the second power supply;
   a second plurality of capacitors connected to the second power supply;
   a first plurality of switches configured to selectively connect the first plurality of capacitors to the first output node based on the digital control code; and
   a second plurality of switches configured to selectively connect the second plurality of capacitors to the second output node based on the digital control code.

12. The multi-phase signal generator of claim 11, wherein the plurality of first and second switches are configured to increase capacitances of the plurality of the first and second capacitors respectively connected between the first and second output nodes and the second power supply as the digital control code increases.

13. The multi-phase signal generator of claim 12, wherein each of the plurality of first and second capacitor comprises:
   a first capacitor; and
   a second capacitor, and a capacitance of the second capacitor is double a capacitance of the first capacitor.

14. The multi-phase signal generator of claim 11, wherein the duty ratio increases when the digital control code increases.

15. The multi-phase signal generator of claim 6, wherein the digital control code generator comprises:
   a comparator configured to compare the control voltage with the reference voltage and generate a comparison result signal; and
   a counter configured to change the digital control code in response to the comparison result signal.

16. The multi-phase signal generator of claim 15, wherein the comparison result signal is generated at a first logic level when the reference voltage is higher than the control voltage and the counter increases the digital control code, and the comparison result signal is generated at a second logic level when the reference voltage is lower than the control voltage and the counter decreases the digital control code.

17. The multi-phase signal generator of claim 15, wherein the digital control code generator further comprises a level-down transistor configured to turn on in response to the comparison result signal and decrease a level of the reference voltage, and wherein the counter increases the digital control code in response to the comparison result signal.

18. The multi-phase signal generator of claim 1, further comprising:
   an XOR gate configured to perform the logic operation and output an XOR signal as the logic signal.

19. The multi-phase signal generator of claim 18, wherein the control voltage generator comprises a charge pump configured to charge in response to a first logic level of the XOR signal and discharge in response to a second logic level of the XOR signal.

20. The multi-phase signal generator of claim 1, wherein the first and second differential input signals have a 180-degree phase difference with respect to each other, and the first and second pulse signals have a 90-degree phase difference with respect to each other.

21. The multi-phase signal generator of claim 1, wherein
   the first edge combiner includes a rising edge combiner and the first edge is a rising edge; and
   the second edge combiner includes a falling edge combiner and the second edge is a falling edge.

22. The multi-phase signal generator of claim 21, wherein the first pulse signal transits from a first logic level to a second logic level in response to the rising edge of the first differential output signal and transits from the second logic level to the first logic level in response to the rising edge of the second differential output signal, and the second pulse signal transits from the first logic level to the second logic level in response to the falling edge of the first differential output signal and transits from the second logic level to the first logic level in response to the falling edge of the second differential output signal.

23. The multi-phase signal generator of claim 1, wherein the variable duty ratios of the first and second differential output signals decrease when the control voltage increases.

24. A method of generating a multi-phase signal, comprising:
   generating a first differential output signal and a second differential output signal based on a first differential input signal, a second differential input signal, and a control voltage such that duty ratios of the first differential output signal and the second differential output signal change based on the control voltage;
   generating a first pulse signal based on first edges of the first and second differential output signals;
   generating a second pulse signal based on second edges of the first and second differential output signals; and
   generating the control voltage in response to a logic signal obtained by performing a logic operation on the first and second pulse signals,
   wherein the first pulse signal transits to a first level in response to the first edge of one of the first and second differential output signals, transits to a second level in response to the first edge of the other of the first and second differential output signals, and
   the second pulse signal transits to the first level in response to the second edge of one of the first and second differential output signals, transits to the second level in response to the second edge of the other of the first and second differential output signals.

25. A method of generating a multi-phase signal, comprising:

generating a first differential output signal and a second differential output signal based on a first differential input signal, a second differential input signal, and a control voltage such that duty ratios of the first differential output signal and the second differential output signal change based on the control voltage;

generating a first pulse signal based on first edges of the first and second differential output signals;

generating a second pulse signal based on second edges of the first and second differential output signals;

generating the control voltage in response to a logic signal obtained by performing a logic operation on the first and second pulse signals;

comparing the control voltage with a reference voltage and generating a digital control code based on a result of the comparison; and changing the duty ratios of the first and second differential output signals by generating the first and second differential output signals based on the control voltage and the digital control code.

26. The method of claim 25, wherein the duty ratio increases when the digital control code increases.

27. The method of claim 25, wherein performing the logic operation includes an XOR operation on the first and second pulse signals, and outputting an XOR signal as the logic signal.

28. The method of claim 27, further comprising:
charge pumping in response to a first logic level of the XOR signal and discharge pumping in response to a second logic level of the XOR signal to generate the control voltage.

29. The method of claim 25, wherein the first and second differential input signals have a 180-degree phase difference with respect to each other, and the first and second pulse signals have a 90-degree phase difference with respect to each other.

30. The method of claim 25, wherein the first edges are rising edges of the first and second output signals, respectively, and the second edges are falling edges of the first and second output signals, respectively.

* * * * *